(12) United States Patent
Li

(10) Patent No.: US 10,134,339 B2
(45) Date of Patent: Nov. 20, 2018

(54) SHIFT REGISTER UNIT AND DRIVING METHOD THEREOF, GATE DRIVING CIRCUIT

(71) Applicant: BOE TECHNOLOGY GROUP CO., LTD., Beijing (CN)

(72) Inventor: Quanhu Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 242 days.

(21) Appl. No.: 15/127,770

(22) PCT Filed: Oct. 20, 2015

(86) PCT No.: PCT/CN2015/092295
§ 371 (c)(1),
(2) Date: Sep. 20, 2016

(87) PCT Pub. No.: WO2016/184027
PCT Pub. Date: Nov. 24, 2016

(65) Prior Publication Data
US 2018/0174660 A1  Jun. 21, 2018

(30) Foreign Application Priority Data

May 15, 2015 (CN) .......................... 2015 1 0251257

(51) Int. Cl.
*G11C 19/28* (2006.01)
*G09G 3/3266* (2016.01)
(Continued)

(52) U.S. Cl.
CPC .............. *G09G 3/3266* (2013.01); *G09G 3/32* (2013.01); *G09G 3/3225* (2013.01); *G11C 19/28* (2013.01); *G09G 2310/0286* (2013.01)

(58) Field of Classification Search
CPC .. G09G 3/3225; G09G 3/3266; G09G 3/3677; G09G 2310/0286; G11C 19/28
See application file for complete search history.

(56) References Cited

U.S. PATENT DOCUMENTS 7,499,517 B2   3/2009  Lin et al.
9,792,869 B1 * 10/2017  Sung .................... G09G 3/3648
(Continued)

FOREIGN PATENT DOCUMENTS

CN  102831860 A  10/2014
CN  102682689 A  11/2014
(Continued)

OTHER PUBLICATIONS

Office Action in Chinese Application No. 201510251257.9 dated Jul. 28, 2017, with English translation.
(Continued)

*Primary Examiner* — Patrick O'Neill
(74) *Attorney, Agent, or Firm* — Womble Bond Dickinson (US) LLP

(57) ABSTRACT

The present invention discloses a shift register unit and method for driving it, and a gate driving circuit. The shift register unit comprises an output module, an unset module and an unset control module; wherein a control terminal of the output module, an output terminal of the unset module are connected to a first node; an output terminal of the unset control module is connected to a control terminal of the unset module; the unset module is configured to be turned off under the control of a control signal accessed to a control terminal of the unset control module so as to prevent the unset module from unsetting the first node, such that the output module outputs a shift signal having multiple pulses during the period in which the unset module is turned off.

27 Claims, 4 Drawing Sheets

(51) Int. Cl.
*G09G 3/32* (2016.01)
*G09G 3/3225* (2016.01)

(56) References Cited

U.S. PATENT DOCUMENTS

| | | | |
|---|---|---|---|
| 9,818,339 B2* | 11/2017 | Li | ........................ G09G 3/3225 |
| 9,881,690 B2* | 1/2018 | Li | ........................ G09G 3/3266 |
| 2008/0266275 A1 | 10/2008 | Tsai et al. | |
| 2017/0069286 A1* | 3/2017 | Wu | ........................ G09G 3/20 |

FOREIGN PATENT DOCUMENTS

| | | |
|---|---|---|
| CN | 104425035 A | 3/2015 |
| CN | 104575396 A | 4/2015 |
| CN | 104575419 A | 4/2015 |
| CN | 104809985 A | 7/2015 |

OTHER PUBLICATIONS

International Search Report and Written Opinion in PCT/CN2015/092295 dated Jan. 19, 2016, with English translation. 16 pages.
Office Action in Chinese Application No. 201510251257.9 dated Nov. 4, 2016, with English translation. 12 pages.

* cited by examiner

SHIFT REGISTER UNIT AND DRIVING METHOD THEREOF, GATE DRIVING CIRCUIT

RELATED APPLICATIONS

The present application is the U.S. national phase entry of PCT/CN2015/092295, with an international filing date of Oct. 20, 2015, which claims the benefit of Chinese Patent Application No. 201510251257.9, filed on May 15, 2015, the entire disclosures of which are incorporated herein by reference.

FIELD

The present disclosure relates to the field of display technologies, and particularly to a shift register unit and method for driving the same, and a gate driving circuit.

BACKGROUND

Organic light emitting diode (OLED), as a current-type light emitting device, is applied increasingly in the high performance display field since it is characterized by spontaneous light emission, fast response, wide viewing angle, being manufacturable on a flexible substrate, etc. The OLED display device can be classified into two types in terms of the driving manner: passive matrix driving OLED (PMOLED) and active matrix driving OLED (AMOLED). The AMOLED display is likely to become a next-generation novel flat panel display in place of the liquid crystal display (LCD) due to its advantages including low manufacture cost, high response speed, power saving, direct current drive usable in a portable device, wide operating temperature range, and so on. Consequently, the AMOLED display panel is preferred by more and more people.

The AMOLED display panel generally needs to be driven by a shift signal having multiple pulses. In addition, the LCD panel also needs to be driven by a shift signal having multiple pulses such that it is sufficiently charged. However, the prior art shift register unit can only generate a shift signal having a single pulse, rather than a shift signal having multiple pulses.

SUMMARY

It is an object of the present disclosure to provide an improved shift register unit and method for driving it, and a gate driving circuit.

To this end, a first aspect of the present disclosure provides a shift register unit. The shift register unit may comprise an output module, an unset module and an unset control module; wherein a control terminal of the output module and an output terminal of the unset module are connected to a first node; an output terminal of the unset control module is connected to a control terminal of the unset module; the unset module is configured to be turned off under the control of a control signal accessed to a control terminal of the unset control module so as to prevent the unset module from unsetting the first node, such that the output module outputs a shift signal having multiple pulses during the period in which the unset module is turned off.

The shift register unit provided by the present disclosure comprises an output module, an unset module and an unset control module; wherein a control terminal of the output module and an output terminal of the unset module are connected to a first node; an output terminal of the unset control module is connected to a control terminal of the unset module; the unset module is configured to be turned off under the control of a control signal accessed to a control terminal of the unset control module so as to prevent the unset module from unsetting the first node, such that the output module outputs a shift signal having multiple pulses during the period in which the unset module is turned off. Therefore, in accordance with the technical solution of the present disclosure, a gate driving signal having multiple pulses can be outputted by one shift register unit.

In accordance with a second aspect of the present disclosure, there is further provided a gate driving circuit. The gate driving circuit may comprise a plurality of shift register units described above, and may further comprise a first clock signal line and a second clock signal line. The phase of the first clock signal line is opposite to that of the second clock signal line. The input terminals of the output modules of respective shift register units are connected to the second clock signal line.

In accordance with a third aspect of the present disclosure, there is further provided a method for driving the above shift register unit. The method may comprise: after the to-be-shifted signal outputs a shift signal having the same number of pulses as the received multiple pulses, applying a control signal to the control terminal of the unset control module to turn off the unset module so as to prevent the unset module from unsetting the first node.

The beneficial effects of the gate driving circuit and the method for driving a shift register unit in the present disclosure are the same as those of the above shift register unit, which will not be discussed here for simplicity.

BRIEF DESCRIPTION OF DRAWINGS

To illustrate embodiments of the present disclosure or technical solutions in the prior art more clearly, the drawings required for describing the embodiments are introduced simply below. Apparently, the drawings described below are only some embodiments of the present disclosure. Those ordinarily skilled in the art can further obtain other drawings based on these drawings without spending inventive efforts.

DETAILED DESCRIPTION

Figure 1:
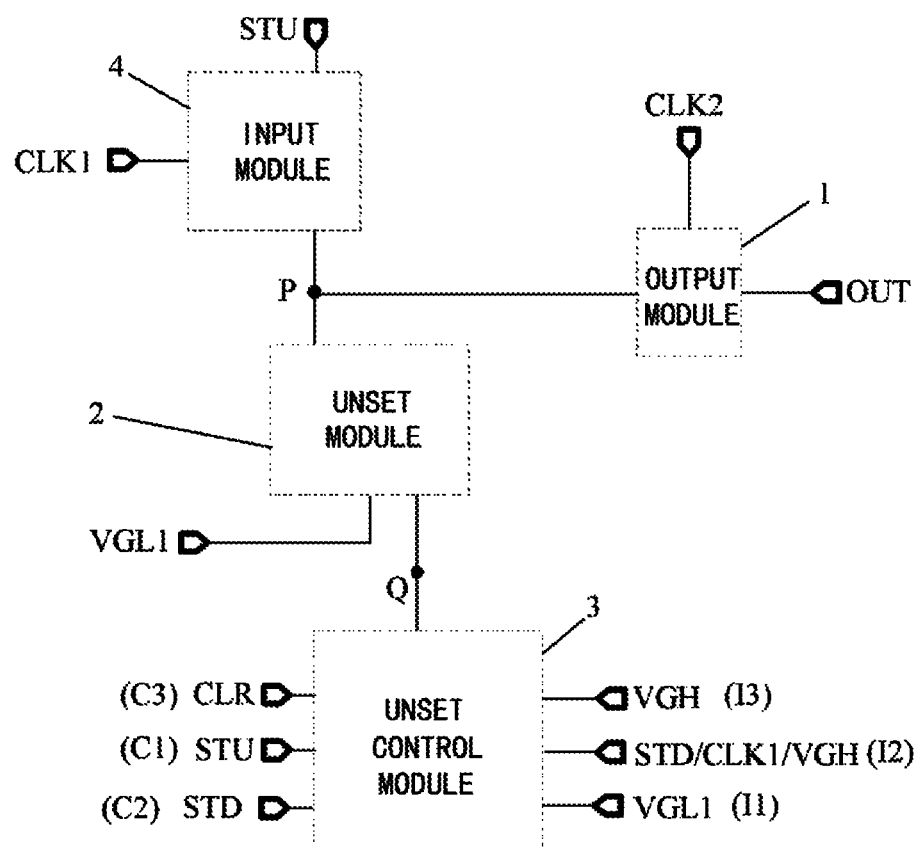
FIG. 1 is a modular schematic diagram of a shift register unit in embodiments of the present disclosure.

The technical solutions in embodiments of the present disclosure are described below in a clear and complete manner with reference to the drawings in embodiments of the present disclosure. Apparently, the described embodiments are part of the embodiments of the present disclosure rather than all of them. All other embodiments obtained by those ordinarily skilled in the art based on the embodiments of the present disclosure without spending inventive efforts fall within the protection scope of the present disclosure.

In the drawings, the following reference signs are used.

1 - output module  2 - unset module
3 - unset control module  4 - input module

| | |
|---|---|
| 5 - level maintenance module | 6 - load module |
| 7 - pinch-off module | 8 - auxiliary output module |
| 9 - reset module | 91 - first reset module |
| 92 - second reset module | 93 - third reset module. |

Embodiments of the present disclosure provide a shift register unit. Specifically, the shift register unit comprises, as shown in FIG. 1, an output module 1, an unset module 2 and an unset control module 3; wherein a control terminal of the output module 1 and an output terminal of the unset module 2 are connected to a first node P, an output terminal of the unset control module 3 is connected to the control terminal of the unset module 2; wherein the unset module 2 is configured to be turned off under the control of a control signal accessed to the control terminal of the unset control module 3 so as to prevent the unset module 2 from unsetting the first node P, such that the output module 1 outputs a shift signal having multiple pulses during the period in which the unset module 2 is turned off.

Upon specific implementation, those skilled in the art can apply a control signal to the control terminal of the unset control module 3 after the output module 1 outputs a shift signal having a practically required number of pulses, so as to turn on the unset module 2. The unset module 2 unsets the first node P to end output of the shift signal having multiple pulses.

To facilitate differentiation, the control terminals of respective modules are denoted by C in the drawings, the input terminals or access terminals thereof are denoted by I, the x-th output terminal is denoted by Ix, and the x-th control terminal is denoted by Cx.

Illustratively, as shown in FIG. 1, the control terminal of the unset control module 3 comprises a first control terminal C1, a second control terminal C2 and a third control terminal C3, which is configured to turn off the unset module 2 when the first control terminal C1 accesses a first level and the third control terminal C3 accesses a second level, so as to prevent the unset module 2 from unsetting the first node P; and turn on the unset module 2 when the first control terminal C1 accesses the second level and the second control terminal C2 accesses the first level, or when the first control terminal C1 accesses the second level and the third control terminal C3 accesses the first level, so as to unset the first node P.

Further, as shown in FIG. 1, the first control terminal C1 of the unset control module 3 is connected to a to-be-shifted signal input terminal, the second control terminal C2 is connected to a shift signal output terminal of next-stage shift register unit, and the third control terminal C3 is connected to a global reset signal input terminal. The pulse levels in the to-be-shifted signal, the shift signal and the global reset signal are identical with the first level, and the non-pulse levels in the to-be-shifted signal, the shift signal and the global reset signal are identical with the second level.

Further, as shown in FIG. 1, the unset control module 3 comprises a first access terminal I1, a second access terminal I2 and a third access terminal I3. The first access terminal I1 is used for accessing an unset turn-off level that enables the unset module 2 to be turned off, the second access terminal I2 is used for accessing an unset turn-on level that enables the unset module 2 to be turned on, and the third access terminal I3 is used for accessing an unset turn-on level that enables the unset module 2 to be turned on. The unset control module 3 is configured to conduct the first access terminal I1 with the output terminal when the first control terminal C1 accesses the first level, conduct the second access terminal I2 with the output terminal when the second control terminal C2 accesses the first level, and conduct the third access terminal I3 with the output terminal when the third control terminal C3 accesses the first level. When the output terminal is conducted with both the first access terminal I1 and the second access terminal I2, the level thereof is kept identical with that of the first access terminal I1.

At the phase in which the present-stage shift register unit outputs a shift signal, when the to-be-shifted signal inputted to the present-stage shift register unit is at a pulse level, the unset turn-off level accessed to the first access terminal I1 is provided to the control terminal of the unset module 2, thereby turning off the unset module 2. When the to-be-shifted signal inputted to the present-stage shift register unit is at a non-pulse level, and the shift signal outputted by the next-stage shift register unit is also at a non-pulse level, the unset module 2 maintains that it cannot be turned on. When the shift signal outputted by the next-stage shift register unit is at the last pulse level, the to-be-shifted signal inputted into the present-stage shift register unit is no longer at a pulse level, such that the unset turn-on level accessed to the second access terminal I2 is provided to the control terminal of the unset module 2 to turn on the unset module 2. The unset module 2 has unset the first node P. Or, when the to-be-shifted signal is before a first pulse level, and the global reset signal is at a pulse level, the unset turn-on level accessed to the third access terminal I3 is provided to the control terminal of the unset module 2 such that the unset module 2 is turned on. The unset module 2 has unset the first node P. Thereafter, the output module 1 of the present-stage shift register unit is turned off and no longer outputs a pulse level. In this manner, the first node P can be allowed to be conducted within multiple clocks such that the output module 1 outputs a shift signal having multiple pulses.

Further, as shown in FIG. 1, the first access terminal I1 of the unset control module 3 is connected to a first common electrode, and the level of the first common electrode is identical with the unset turn-off level. The second access terminal I2 of the unset control module 3 is connected to a second common electrode, or to a shift signal output terminal of a next-stage shift register unit, or to a first clock signal input terminal, and the level of the second common electrode is identical with the unset turn-on level. A clock signal accessed to the first clock signal input terminal is at an unset turn-on level when the second access terminal I2 of the unset control module 3 is conducted with the output terminal of the unset control module 3. The third access terminal I3 of the unset control module 3 is connected to the second common electrode.

It is to be noted that during practical application, the first access terminal I1, the second access terminal I2 and the third access terminal I3 of the unset control module 3 can also be connected to other input terminals, as long as the first access terminal I1 is at an unset turn-off level when the first access terminal I1 of the unset control module 3 is conducted with the output terminal, the second access terminal I2 is at an unset turn-on level when the second access terminal I2 is conducted with the output terminal, and the third access terminal I3 is at an unset turn-on level when the third access terminal I3 is conducted with the output terminal. Their corresponding technical solutions can all carry out the technical solution of the present disclosure, and accordingly shall also fall within the protection scope of the present disclosure.

Figure 3:
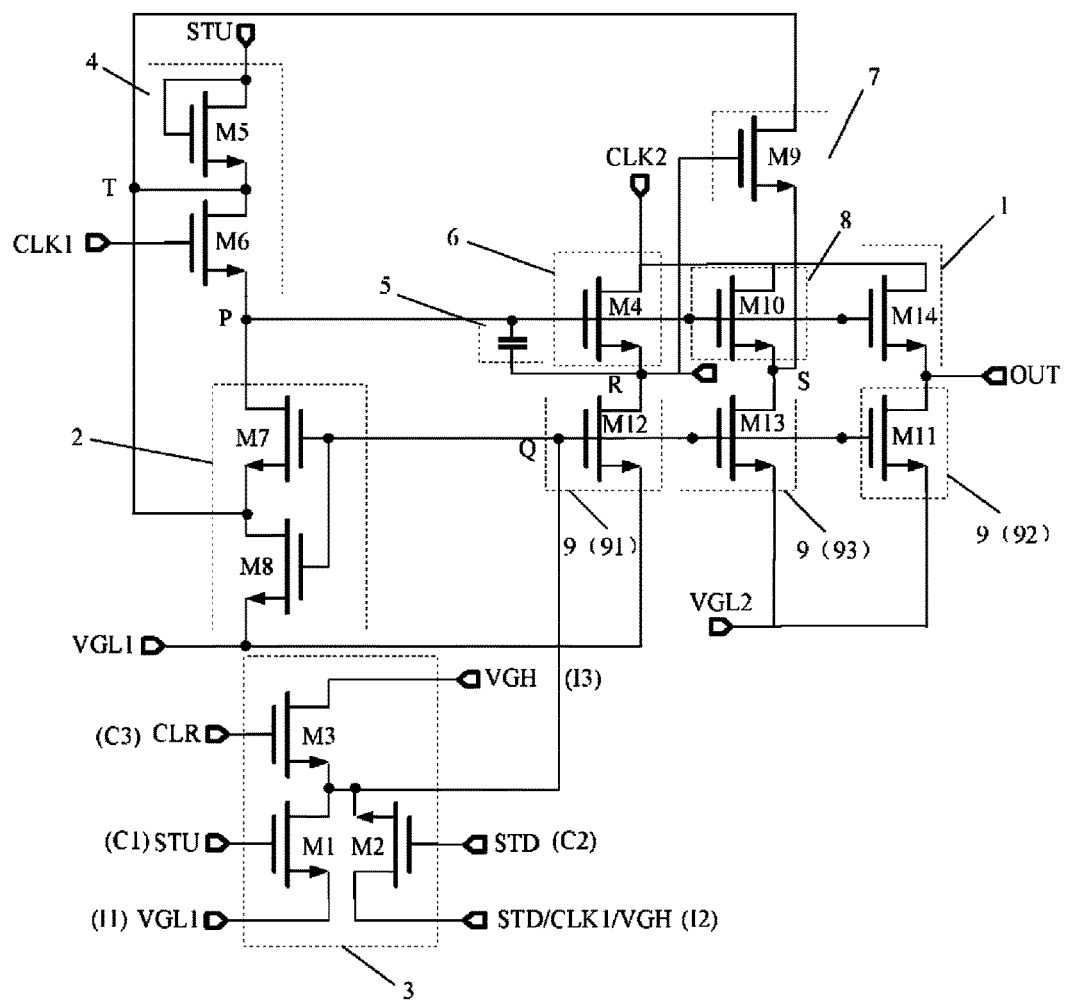
FIG. 3 is a circuit schematic diagram of FIG. 2.

Illustratively, as shown in FIG. 3, the unset control module 3 comprises a first transistor M1, a second transistor M2 and a third transistor M3. The first transistor M1, the second transistor M2 and the third transistor M3 are all turned on when the control terminals access the first level, and turned off when accessing the second level. A first terminal of the first transistor M1 is connected to the first access terminal I1 of the unset control module 3, a control terminal of the first transistor M1 is connected to the first control terminal C1 of the unset control module 3, and a second terminal of the first transistor M1 is connected to the output terminal of the unset control module 3. A first terminal of the second transistor M2 is connected to the second access terminal I2 of the unset control module 3, a control terminal of the second transistor M2 is connected to the second control terminal C2 of the unset control module 3, and a second terminal of the second transistor M2 is connected to the output terminal of the unset control module 3. A first terminal of the third transistor M3 is connected to the third access terminal I3 of the unset control module 3, a control terminal of the third transistor M3 is connected to the third control terminal C3 of the unset control module 3, and a second terminal of the third transistor M3 is connected to the output terminal of the unset control module 3. The channel width-to-length ratio of the first transistor M1 is larger than that of the second transistor M2, such that the level of the output terminal of the unset control module 3 is under the control of the level of the first access terminal of the unset control module 3 to which the first terminal of the first transistor M1 is connected when the first transistor M1 and the second transistor M2 are both turned on. That is, when the first transistor M1 is turned on, regardless of whether the second transistor M2 is turned on, the level of the output terminal of the unset control module 3 would be identical with that of the first access terminal I1 to which the first transistor M1 is connected, i.e. unset turn-off level; only when the first transistor M1 is turned off while the second transistor M2 is turned on, the level of the output terminal of the unset control module 3 would be identical with the level of the second access terminal I2 to which the second transistor M2 is connected.

It is to be noted that the above output module 1 may be identical with the output module of the prior art shift register unit, both of which indicate a module for outputting a shift signal. Illustratively, the input terminal of the output module 1 is generally connected to a clock signal input terminal. When the first node P is set at a level that enables the output module 1 to be turned on, a segment of clock signal is intercepted and outputted. This part of clock signal constitutes a shift signal. Then, when the first node P is unset, the output module 1 is turned off and no longer outputs the clock signal. Certainly, in practical application, the output module 1 can also be other modules that can output a shift signal, which will not be discussed in the present disclosure in detail.

The above unset module 2 can also be identical with the unset module in the prior art, both of which indicate a module that unsets the first node P. Illustratively, the access terminal of the unset module 2 can be connected to an output turn-off level that enables the output module 1 to be turned off. When the unset module 2 is turned on, the output turn-off level is connected to the first node P, at that time the first node P is set at the output turn-off level. For example, as shown in FIG. 3, the unset module 2 comprises a seventh transistor M7 and an eighth transistor M8, wherein a first terminal of the seventh transistor M7 is connected to the output terminal of the unset module 2 (i.e. first node P), a second terminal of the seventh transistor M7 is connected to a first terminal of the eighth transistor M8, a second terminal of the eighth transistor M8 is connected to the input terminal of the unset module 2 (i.e. first common electrode), and a control terminal of the seventh transistor M7 and a control terminal of an eighth transistor M8 are both connected to the control terminal of the unset module 2 (i.e. output terminal of the unset control module 3).

Figure 2:
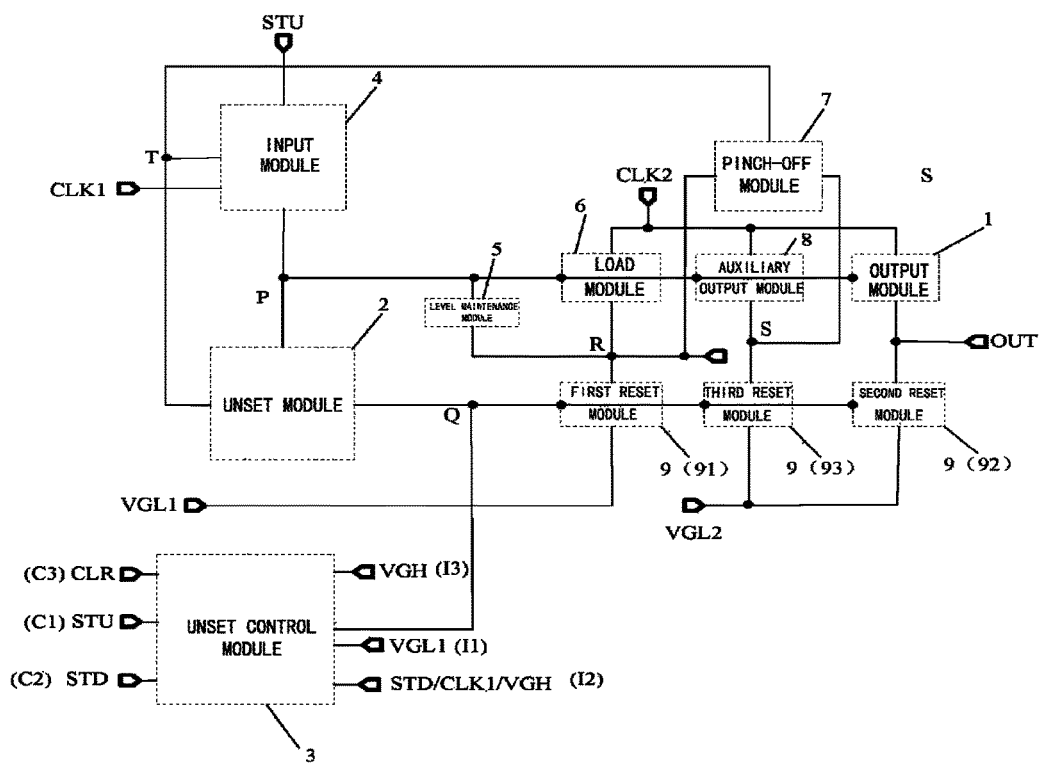
FIG. 2 is another modular schematic diagram of a shift register unit in embodiments of the present disclosure.

In addition, as shown in FIGS. 1 and 2, the shift register unit may further comprise an input module 4, wherein an output terminal of the input module 4 is connected to the first node P and the input module 4 is configured to set the first node P at an output turn-on level that enables the output module 1 to be turned on when the received to-be-shifted signal is at a pulse level. At that time, the output module 1 is configured to output a shift signal when the level of the first node is an output turn-on level. The unset module 2 is configured to, after the output module 1 outputs the shift signal, unset the level of the first node P at an output turn-off level that enables the output module 1 to be turned off.

Illustratively, as shown in FIG. 3, the input module 4 comprises a fifth transistor M5 and a sixth transistor M6, wherein a first terminal and a control terminal of the fifth transistor M5 are both connected to the input terminal of the input module 4 (i.e. to-be-shifted signal input terminal), a second terminal of the fifth transistor M5 is connected to a first terminal of the sixth transistor M6, a control terminal of the sixth transistor M6 is connected to the control terminal of the input module 4 (i.e. first clock signal input terminal), and a second terminal of the sixth transistor M6 is connected to the output terminal of the input module 4 (i.e. first node P).

Alternatively, as shown in FIGS. 2 and 3, the shift register unit may further comprise a level maintenance module 5. The level maintenance module 5 is connected to the first node P and configured to maintain the level of the first node P when the input module 4 and the unset module 2 are both turned off. Illustratively, the level maintenance module 5 comprises a first capacitor C1, and one plate of the first capacitor C1 is connected to the first node P.

Alternatively, as shown in FIGS. 2 and 3, the shift register unit further comprises a load module 6. A control terminal of the load module 6 is connected to the first node P and the load module 6 is configured to output a shift signal when the level of the first node P is an output turn-on level. Illustratively, the structure of the load module 6 may be identical with that of the output module 1. The resulting benefit is that the shift signal outputted by the load module 6 can be used for other control terminals (such as the input terminal of the next-stage shift register unit), thereby preventing other control terminals from weakening the pulse level outputted by the output module 1 when accessed to the output terminal of the output module 1.

Illustratively, as shown in FIG. 3, the load module 6 comprises a fourth transistor M4, wherein a first terminal of the fourth transistor M4 is connected to the input terminal of the load module 6, a second terminal of the fourth transistor M4 is connected to an output terminal of the load module 6, and a control terminal of the fourth transistor M4 is connected to the control terminal of the load module 6.

Alternatively, as shown in FIGS. 2 and 3, the shift register unit may further comprise a pinch-off module 7 configured to be turned on when the outputted shift signal is at a pulse level, so as to pinch off the input module 4 and/or the unset module 2. The resulting benefits lie in preventing the charges of the first node P from flowing to the input module 4 or the unset module 2 when the output module 1 or the load module 6 outputs pulse level, which consequently impacts on the level of the first node P, and ensuring that the pulse level outputted by the output module 1 has a good waveform.

Further, as shown in FIGS. 2 and 3, the shift register unit may further comprise an auxiliary output module 8, wherein a control terminal of the auxiliary output module 8 is connected to the first node P. The auxiliary output module 8 is configured to output a shift signal when the level of the first node P is an output turn-on level, wherein the pulse level of the shift signal is identical with the output turn-on level.

When the input module 4 and the unset module 2 comprise a transistor combination consisting of two transistors connected in series, a control terminal of the pinch-off module 7 is connected to the output terminal of the load module 6, an input terminal of the pinch-off module 7 is connected to an output terminal of the auxiliary output module 8, and an output terminal of the pinch-off module 7 is connected to the position where the two transistors are connected in series in the transistor combination. The input terminal and the output terminal of the pinch-off module 7 are conducted when the output terminals of the load module 6 and the auxiliary output module 8 output the pulse level in the shift signal, such that the level at the position where the two transistors are connected in series in the transistor combination is identical with the output turn-on level.

It is to be noted that the specific structure that the input module 4 and the unset module 2 comprise a transistor combination consisting of two transistors connected in series has been described in detail in the above contents, which will not be further discussed here.

Alternatively, as shown in FIG. 3, the pinch-off module 7 comprises a ninth transistor M9, wherein a first terminal of the ninth transistor M9 is connected to the input terminal of the pinch-off module 7, a second terminal of the ninth transistor M9 is connected to the output terminal of the pinch-off module 7, and a control terminal of the ninth transistor M9 is connected to the control terminal of the pinch-off module 7.

Alternatively, as shown in FIG. 3, the auxiliary output module 8 comprises a tenth transistor M10, wherein a first terminal of the tenth transistor M10 is connected to the input terminal of the auxiliary output module 8, a second terminal of the tenth transistor M10 is connected to the output terminal of the auxiliary output module 8, and a control terminal of the tenth transistor M10 is connected to the control terminal of the auxiliary output module 8.

Alternatively, as shown in FIGS. 2 and 3, the shift register unit may further comprise three reset modules 9. The three reset modules 9 are used for resetting the output terminals of the output module 1, the load module 6 and the auxiliary output module 8 respectively after the output module 1 outputs a shift signal, such that the levels at respective output terminals are kept as non-pulse levels.

Further, as shown in FIGS. 2 and 3, the control terminals of the three reset modules 9 are connected to the output terminal of the unset control module 3, the input terminals of the three reset modules 9 are all used for accessing a non-pulse level, and the output terminals of the three reset modules 9 are connected to the output terminals of the output module 1, the load module 6 and the auxiliary output module 8, respectively. The input terminals and the output terminals of the reset modules 9 are conducted when the output terminal of the unset control module 3 outputs an unset turn-on level. Since the control terminals of the three reset modules 9 are connected to the output terminal of the unset control module 3 such that the level of the output terminal of the unset control module 3 is the same as those of the control terminals of the three reset modules 9, there is no need to arrange a circuit individually for controlling the levels of the control terminals of the three reset modules 9, which can consequently simplify the circuit structure of the shift register unit.

Figure 4:
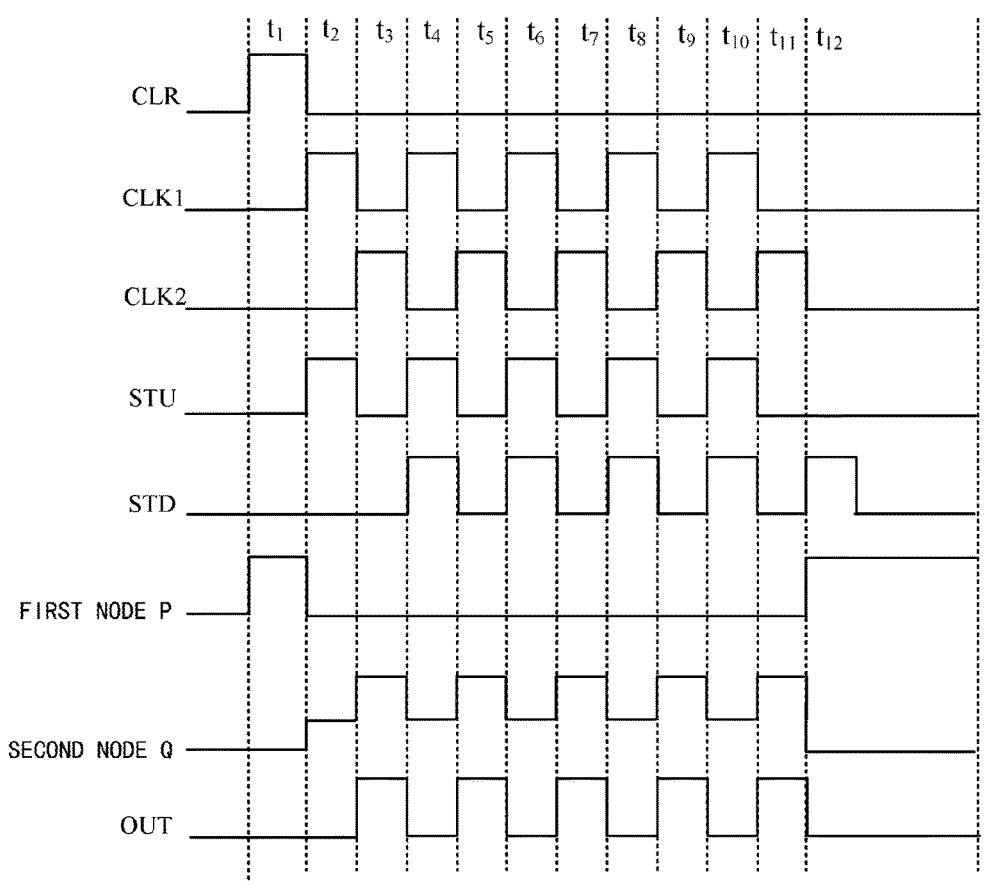
FIG. 4 is a timing diagram showing the process of driving the shift register unit in FIG. 3.

Specifically, the reason why the unset control module 3 can play the above role lies in that the unset control module 3 comprises the third control terminal C3 and the third input terminal I3. Illustratively, when the transistors in the shift register unit are all N-type transistors, a global reset signal CLR is inputted to the third control terminal C3 and a high level signal VGH is inputted to the third input terminal I3. As shown in FIGS. 3 and 4, before the to-be-shifted signal STU comes, the global reset signal CLR is at a high level, the level of the output terminal of the unset control module 3 (which is the second node Q in the figures) is pulled up such that the control terminals of the three reset modules 9 are at a high level, and the input terminals and the output terminals of the three reset modules 9 are conducted to transmit the low level at the input terminals of the three reset module 9 to the output terminals of the three reset modules 9, the output terminals of the three reset modules 9 therefore all output a low level, thereby maintaining the stability of the entire circuit.

If the unset control module 3 does not comprise the third control terminal C3 and the third input terminal I3, before the to-be-shifted signal STU comes, the level of the output terminal of the unset control module 3 is undetermined, such that the entire circuit cannot remain stable. If it is required to maintain the stability of the entire circuit, there is a need to arrange a circuit individually for controlling the levels of the control terminals of the three reset modules 9, thereby leading to a complicated circuit of the shift register unit.

Further, as shown in FIG. 3, the three reset modules 9 are a first reset module 91, a second reset module 92 and a third reset module 93.

The first reset module 91 comprises an eleventh transistor M11. A control terminal of the eleventh transistor M11 is connected to a control terminal of the first reset module 91 (i.e. output terminal of the unset module 2), an input terminal of the eleventh transistor M11 is connected to an input terminal of the first reset module 91 (i.e. third common electrode, the level of the third common electrode being identical with the non-pulse level), and an output terminal of the eleventh transistor M11 is connected to an output terminal of the first reset module 91 (i.e. output terminal of the output module 1).

The second reset module 92 comprises a twelfth transistor M12. A control terminal of the twelfth transistor M12 is connected to a control terminal of the second reset module 92 (i.e. output terminal of the unset module 2), an input terminal of the twelfth transistor M12 is connected to an input terminal of the second reset module 92 (i.e. first common electrode), and an output terminal of the twelfth transistor M12 is connected to an output terminal of the second reset module 92 (i.e. output terminal of the load module 6).

The third reset module 93 comprises a thirteenth transistor M13. A control terminal of the thirteenth transistor M13 is connected to a control terminal of the third reset module 93 (output terminal of the unset module 2), an input terminal of the thirteenth transistor M13 is connected to an input terminal of the third reset module 93 (i.e. third common electrode), and an output terminal of the thirteenth transistor M13 is connected to an output terminal of the third reset module 93 (i.e. output terminal of the auxiliary output module 8).

In addition, as shown in FIG. 3, the output module 1 comprises a fourteenth transistor 14. A control terminal of the fourteenth transistor M14 is connected to the control terminal of the output module 4 (i.e. first node P), an input terminal of the fourteenth transistor M14 is connected to the input terminal of the output module 4 (i.e. second clock signal input terminal), and an output terminal of the fourteenth transistor M14 is connected to the output terminal of the output module 4.

Illustratively, the respective transistors comprised in the shift register unit in embodiments of the present disclosure are all N-type transistors. In addition, the turn-on levels of the respective modules are high levels, while the turn-off levels are low levels. In this way, such arrangement can unify the manufacture processes to decrease the difficulty in manufacture. At that time, a first low level signal VGL1 is inputted to the first common electrode mentioned above, a high level signal VGH is inputted to the second common electrode, and a second low level signal VGL2 is inputted to the third common electrode.

In illustrative embodiments of the present disclosure, the level of the first low level signal VGL1 is much lower than the level of the second low level signal VGL2, such that even if there is some noise interference in the first low level signal VGL1, the level at the output terminal of the unset control module 3 is not enough to enable the transistor to which the control terminal is connected to be turned on, which can consequently avoid noise interference to some extent and facilitate maintenance of the performance stability of the shift register unit.

Certainly, in practical application, the technical solution of the present disclosure can also be effected when some of the transistors employ P-type transistors. For example, in embodiments of the present disclosure, when the respective transistors in the above unset control module are all P-type transistors, the technical solution of the present disclosure can also be effected, which accordingly falls within the protection scope of the present disclosure.

The shift register unit provided by the present disclosure comprises an output module, an unset module and an unset control module; wherein a control terminal of the output module and an output terminal of the unset module are connected to a first node; an output terminal of the unset control module is connected to a control terminal of the unset module; the unset module is configured to be turned off under the control of a control signal accessed to a control terminal of the unset control module so as to prevent the unset module from unsetting the first node, such that the output module outputs a shift signal having multiple pulses during the period in which the unset module is turned off. Therefore, in accordance with the technical solution of the present disclosure, a gate driving signal having multiple pulses can be outputted by one shift register unit.

Embodiments of the present disclosure further provide a gate driving circuit. The gate driving circuit comprises a plurality of any of the shift register units described above and further comprises a first clock signal line and a second clock signal line. The phase of the first clock signal line is opposite to that of the second clock signal line. The input terminals of output modules of respective shift register units are connected to the second clock signal line.

Illustratively, when the shift register unit comprises an input module, the input terminal of the input module of the first-stage shift register unit is connected to a start signal input terminal.

Further, the second access terminals of the unset control modules of respective shift register units are connected to the first clock signal line, and the input terminals of the output modules of respective shift register units are connected to the second clock signal line.

Further, when the input modules of respective shift register units comprise a transistor combination consisting of two transistors connected in series, the control terminals of the transistors in the input modules which are connected to the first node are connected to the first clock signal line.

The beneficial effects of the gate driving circuit in embodiments of the present disclosure are the same as those of the above shift register unit, which will not be discussed here for simplicity.

Further, embodiments of the present disclosure provide a method for driving any of the shift register unit described above. The method comprises that, after the to-be-shifted signal outputs a shift signal having the same number of pulses as the received multiple pulses, applying a control signal to the control terminal of the unset control module to turn off the unset module so as to prevent the unset module from unsetting the first node.

When the specific structure of the shift register unit is different, the applicable driving method is also somewhat different.

Illustratively, when the unset control module in the shift register unit comprises a first control terminal, a second control terminal and a third control terminal, the above driving method specifically comprises, after the to-be-shifted signal outputs a shift signal having the same number of pulses as the received multiple pulses, accessing a first level to the first control terminal, accessing a second level to the third control terminal.

Illustratively, when the unset control module in the shift register unit comprises a first access terminal, a second access terminal and a third access terminal, the first level is identical with a pulse level, and the second level is identical with a non-pulse level. The above driving method specifically comprises: accessing a to-be-shifted signal to the first control terminal of the unset control module, accessing a shift signal outputted by a next-stage shift register to the second control terminal of the unset control module, accessing a global reset signal to the third control terminal of the unset control module; and when the first control terminal accesses a pulse level, accessing an unset turn-off level to the first access terminal; when the second control terminal accesses a pulse level, accessing an unset turn-on level to the second access terminal; when the third control terminal accesses a pulse level, accessing an unset turn-on level to the third access terminal.

Illustratively, when the shift register unit further comprises a pinch-off module, the above driving method further comprises: when the shift signal outputted by the shift register unit is at a pulse level, applying a control signal to turn on the pinch-off module.

The beneficial effects of the driving method in embodiments of the present disclosure are the same as those of the above shift register unit, which will not be discussed here for simplicity.

In illustrative embodiments of the present disclosure, there is provided a specific driving method for driving the shift register unit shown in FIG. 3. Specifically, the driving method of the shift register unit is divided into 2N+2 phases.

The timing diagram of the driving process is illustrated in FIG. 4 (to facilitate description, the output terminal of the unset control module 3 is marked as the second node Q). FIG. 4 takes the example that N is equal to 5, i.e. the signal output terminal OUT outputs five pulses. It is to be noted that the above driving method is described in detail below in six phases only based on the example that the first to fourteenth transistors are all N-type transistors. At that time, the first to fourteenth transistors are all turned on when the signal applied on the gate is a high level signal and all turned off when it is a low level signal.

First Phase $t_1$:

The global reset signal CLR inputted by the global reset signal input terminal is at a high level, and the to-be-shifted signal STU inputted by the to-be-shifted signal input terminal and the unset signal STD inputted by the shift signal output terminal of the next-stage shift register unit are both at a low level. The third transistor M3 is turned on and the first transistor M1 and the second transistor M2 are both turned off.

The high level signal VGH inputted by the second common electrode is transmitted to the output terminal of the unset control module 3. The output terminal of the unset control module 3 is at a high level such that the seventh transistor M7 and the eighth transistor M8 in the unset module 2 controlled by it are turned on. The first low level signal VGL1 inputted by the first common electrode is transmitted to the first node P. The first node P is at a low level. The output terminal of the unset control module 3 simultaneously controls the eleventh transistor M11, the twelfth transistor M12 and the thirteenth transistor M13 to be turned on. The second low level signal VGL2 inputted by the third common electrode is transmitted the output terminal OUT of the output module via the eleventh transistor M11. The output terminal OUT outputs a low level. The first low level signal VGL1 is transmitted to the third node R via the twelfth transistor M12. The third node R is at a low level. The second low level signal VGL2 is transmitted to the fourth node S via the thirteenth transistor M13. The fourth node S is at a low level.

Second Phase $t_2$:

The global reset signal CLR inputted by the global reset signal input terminal is at a low level, and the to-be-shifted signal STU and the unset signal STD are at a high level. The first transistor M1 and the second transistor M2 are turned on, and the third transistor M3 is turned off. The first low level signal VGL1 is transmitted to the output terminal of the unset control module 3. The output terminal of the unset control module 3 is at a low level. The eleventh transistor M11 is turned off.

The to-be-shifted signal STU and the first clock signal CLK1 are both at a high level. The fifth transistor M5 and the sixth transistor M6 are turned on. The to-be-shifted signal STU is transmitted to the first node P. The first node P is at a high level, the first capacitor C1 is charged, and the fourteenth transistor M14 is turned on. The second clock signal CLK2 is at a low level. The second clock signal CLK2 is transmitted to the output terminal OUT. The output terminal OUT outputs a low level.

Third Phase $t_3$:

The first clock signal CLK1 is at a low level. The sixth transistor M6 is turned off. The first node P is floating. The first capacitor C1 is discharged to enable the first node P to maintain a high level. The second clock signal CLK2 is a high level signal such that the level of the first node P is raised to a higher level, thereby turning on the fourteenth transistor M14. The second clock signal CLK2 is at a high level. The second clock signal CLK2 is transmitted to the output terminal OUT. The output terminal OUT outputs a high level.

Meanwhile, the first node P is at a high level. The fourth transistor M4 and the tenth transistor M10 are both turned on. The second clock signal CLK2 is transmitted to the third node R and the fourth node S such that the third node R and the fourth node S are at a high level. The ninth transistor M9 is turned on. The high level signal is transmitted to the fifth node T such that the leakage current between the fifth transistor M5, the sixth transistor M6, the seventh transistor M7, the eighth transistor M8 and the first node P is reduced significantly so as to ensure that the first node P always maintains a high level during the process of outputting a high level.

The 2M-th Phase $t_{2M}$ is the same as the second phase $t_2$. M is an integer that is greater than or equal to 2 and smaller than or equal to N, and N is the number of pulses outputted by the signal output terminal. In FIG. 4, N is equal to 5, i.e. the number of pulses in the multi-pulse signal outputted by the signal output terminal OUT is 5.

The 2M+1-th Phase $t_{2M+1}$ is the same as the third phase $t_3$.

The 2M+2-th Phase $t_{2M+2}$:

The to-be-shifted signal STU is at a low level, the unset signal STD is at a high level, the third transistor M3 and the first transistor M1 are both turned off, and the second transistor M2 is turned on.

The unset signal STD is transmitted to the output terminal of the unset control module 3. The output terminal of the unset control module 3 is at a high level. The seventh transistor M7 and the eighth transistor M8 are turned on. The first low level signal VGL1 is transmitted to the first node P. The first node P is at a low level such that the fourteenth transistor M14 is turned off. The output terminal of the unset control module 3 simultaneously controls the eleventh transistor M11 to be turned on. The second low level signal VGL2 is transmitted to the output terminal OUT. The output terminal OUT outputs a low level.

Meanwhile, the twelfth transistor M12 and the thirteenth transistor M13 are turned on. The first low level signal VGL1 is transmitted to the third node R and the second low level signal VGL2 is transmitted to the fourth node S such that the levels of the third node R and the fourth node S are pulled down. Moreover, since the seventh transistor M7 and the eighth transistor M8 are turned on, and the first low level signal VGL1 is transmitted to the fifth node T, the fifth node T is pulled down to a low level. The first low level signal VGL1 is transmitted to the first node P, thus the first node P is pulled down to a low level.

Those skilled in the art can clearly understand from the above description of embodiments that the present disclosure can be carried out by means of software plus necessary universal hardware. Certainly, it can also be carried out by means of hardware, but in most cases the former is a better implementing manner. Based on such understanding, the essence of technical solution of the present disclosure or the parts thereof which contribute to the prior art can be embodied in the form of software products. The computer software products are stored in a readable storage medium, e.g. floppy disk, hard disk or optical disk, etc of the computer, which include a number of instructions so as to enable a computer device (which may be a personal computer, server or network device, etc) to carry out the methods stated in respective embodiments of the present disclosure.

What are stated above are only specific embodiments of the present disclosure, and the protection scope of the present disclosure is not so limited. Variations or substitutions that can be easily conceived by the skilled persons familiar with this technical field within the technical scope revealed by the present disclosure shall be encompassed in the protection scope of the present disclosure. Therefore, the protection scope of the present disclosure shall be based on the protection scope of the claims.

The invention claimed is:

1. A shift register unit, comprising:
an output module, an unset module and an unset control module; wherein a control terminal of the output module, an output terminal of the unset module are connected to a first node; an output terminal of the unset control module is connected to a control terminal of the unset module; the unset module is configured to be turned off under the control of a control signal accessed to a control terminal of the unset control module so as to prevent the unset module from unsetting the first node, such that the output module outputs a shift signal having multiple pulses during a period in which the unset module is turned off.

2. The shift register unit according to claim 1, wherein, the control terminal of the unset control module comprises a first control terminal, a second control terminal and a third control terminal, the unset control module being configured to turn off the unset module when the first control terminal accesses a first level and the third control terminal accesses a second level, so as to prevent the unset module from unsetting the first node; to turn on the unset module when the first control terminal accesses the second level and the second control terminal accesses the first level, or the first control terminal accesses the second level and the third control terminal accesses the first level, to unset the first node.

3. The shift register unit according to claim 2, wherein the first control terminal of the unset control module is connected to a to-be-shifted signal input terminal, the second control terminal is connected to a shift signal output terminal of a next-stage shift register unit, and the third control terminal is connected to a global reset signal input terminal; pulse levels in the to-be-shifted signal, the shift signal and the global reset signal being identical with the first level, non-pulse levels in the to-be-shifted signal, the shift signal and the global reset signal being identical with the second level.

4. The shift register unit according to claim 3, wherein the unset control module comprises a first access terminal, a second access terminal and a third access terminal, the first access terminal being used for accessing an unset turn-off level that enables the unset module to be turned off, the second access terminal being used for accessing an unset turn-on level that enables the unset module to be turned on, the third access terminal being used for accessing an unset turn-on level that enables the unset module to be turned on;
the unset control module being configured to conduct the first access terminal with the output terminal when the first control terminal accesses the first level, conduct the second access terminal and the output terminal when the second control terminal accesses the first level, conduct the third access terminal and the output terminal when the third control terminal accesses the first level; and when the output terminal is conducted with both the first access terminal and the second access terminal, a level of the output terminal being kept identical with that of the first access terminal.

5. The shift register unit according to claim 4, wherein the first access terminal of the unset control module is connected to a first common electrode, a level of the first common electrode being identical with the unset turn-off level;
the second access terminal of the unset control module is connected to a second common electrode, or connected to a shift signal output terminal of a next-stage shift register unit, or connected to a first clock signal input terminal; a level of the second common electrode being identical with the unset turn-on level, the clock signal accessed to the first clock signal input terminal being at an unset turn-on level when the second access terminal of the unset control module is conducted with the output terminal of the unset control module;
the third access terminal of the unset control module is connected to the second common electrode.

6. The shift register unit according to claim 5, wherein the unset control module comprises a first transistor, a second transistor and a third transistor, the first transistor, the second transistor and the third transistor all being turned on when the control terminals access the first level, and being turned off when accessing the second level; wherein,
a first terminal of the first transistor is connected to the first access terminal of the unset control module, a control terminal of the first transistor is connected to the first control terminal of the unset control module, a second terminal of the first transistor is connected to the output terminal of the unset control module; a first terminal of the second transistor is connected to the second access terminal of the unset control module, a control terminal of the second transistor is connected to the second control terminal of the unset control module, a second terminal of the second transistor is connected to the output terminal of the unset control module; a first terminal of the third transistor is connected to the third access terminal of the unset control module, a control terminal of the third transistor is connected to the third control terminal of the unset control module, a second terminal of the third transistor is connected to the output terminal of the unset control module; a channel width-to-length ratio of the first transistor being larger than that of the second transistor.

7. The shift register unit according to claim 1, further comprising:
an input module, an output terminal of the input module being connected to the first node, the input module being configured to set the first node at an output turn-on level that enables the output module to be turned on when a received to-be-shifted signal is at a pulse level;
the output module being configured to output a shift signal when a level of the first node is the output turn-on level;
the unset module being configured to, after the output module outputs the shift signal, unset the level of the first node at an output turn-off level that enables the output module to be turned off.

8. The shift register unit according to claim 7, further comprising:
a level maintenance module, the level maintenance module being connected to the first node and configured to maintain the level of the first node when the output module and the unset module are both turned off.

9. The shift register unit according to claim 7, further comprising:
a load module, a control terminal of the load module being connected to the first node, the load module being configured to output a shift signal when the level of the first node is the output turn-on level.

10. The shift register unit according to claim 9, wherein the load module comprises a fourth transistor, a first terminal of the fourth transistor being connected to an input terminal of the load module, a second terminal of the fourth transistor being connected to an output terminal of the load module, a control terminal of the fourth transistor being connected to the control terminal of the load module.

11. The shift register unit according to claim 7, further comprising a pinch-off module configured to be turned on when an outputted shift signal is at a pulse level, so as to pinch off the input module and/or the unset module.

12. The shift register unit according to claim 11, further comprising:
- an auxiliary output module, a control terminal of the auxiliary output module being connected to the first node, the auxiliary output module being configured to output a shift signal when the level of the first node is the output turn-on level; a pulse level of the shift signal being identical with the output turn-on level;
- the input module and the unset module comprising a transistor combination consisting of two transistors connected in series;
- a control terminal of the pinch-off module being connected to the output terminal of the load module, an input terminal of the pinch-off module being connected to an output terminal of the auxiliary output module, an output terminal of the pinch-off module being connected to a position where the two transistors are connected in series in the transistor combination, the pinch-off module being configured to conduct the input terminal with the output terminal of the pinch-off module when output terminals of the load module and the auxiliary output module output the pulse level in the shift signal, such that a level at the position where the two transistors are connected in series in the transistor combination is identical with the output turn-on level.

13. The shift register unit according to claim 12, wherein the input module comprises a fifth transistor and a sixth transistor, a first terminal and a control terminal of the fifth transistor being connected to an input terminal of the input module, a second terminal of the fifth transistor being connected to a first terminal of the sixth transistor, a control terminal of the sixth transistor being connected to a control terminal of the input module, a second terminal of the sixth transistor being connected to the output terminal of the input module;
the unset module comprises a seventh transistor and an eighth transistor, a control terminal of the seventh transistor and a control terminal of the eighth transistor being both connected to the control terminal of the unset module, a first terminal of the seventh transistor being connected to the output terminal of the unset module, a second terminal of the seventh transistor being connected to a first terminal of the eighth transistor, a second terminal of the eighth transistor being connected to an input terminal of the unset module.

14. The shift register unit according to claim 12, wherein the pinch-off module comprises a ninth transistor, a first terminal of the ninth transistor being connected to the input terminal of the pinch-off module, a second terminal of the ninth transistor being connected to the output terminal of the pinch-off module, a control terminal of the ninth transistor being connected to the control terminal of the pinch-off module.

15. The shift register unit according to claim 12, wherein the auxiliary output module comprises a tenth transistor, a first terminal of the tenth transistor being connected to an input terminal of the auxiliary output module, a second terminal of the tenth transistor being connected to the output terminal of the auxiliary output module, a control terminal of the tenth transistor being connected to the control terminal of the auxiliary output module.

16. The shift register unit according to claim 12, further comprising three reset modules, the three reset modules being used for resetting the output terminals of the output module, the load module and the auxiliary output module respectively after the output module outputs a shift signal, such that levels at respective output terminals are kept as non-pulse levels.

17. The shift register unit according to claim 16, wherein control terminals of the three reset modules are connected to the output terminal of the unset control module, input terminals of the three reset modules are all used for accessing a non-pulse level, output terminals of the three reset modules are connected to the output terminals of the output module, the load module and the auxiliary output module respectively; the three reset modules being configured to conduct the input terminals with the output terminals of the reset modules when the output terminal of the unset control module outputs an unset turn-on level.

18. The shift register unit according to claim 17, wherein the three reset modules are a first reset module, a second reset module and a third reset module;
- wherein the first reset module comprises an eleventh transistor, a control terminal of the eleventh transistor being connected to a control terminal of the first reset module, an input terminal of the eleventh transistor being connected to an input terminal of the first reset module, an output terminal of the eleventh transistor being connected to an output terminal of the first reset module;
- the second reset module comprises a twelfth transistor, a control terminal of the twelfth transistor being connected to a control terminal of the second reset module, an input terminal of the twelfth transistor being connected to an input terminal of the second reset module, an output terminal of the twelfth transistor being connected to an output terminal of the second reset module;
- the third reset module comprises a thirteenth transistor, a control terminal of the thirteenth transistor being connected to a control terminal of the third reset module, an input terminal of the thirteenth transistor being connected to an input terminal of the third reset module, an output terminal of the thirteenth transistor being connected to an output terminal of the third reset module.

19. The shift register unit according to claim 1, wherein the output module comprises a fourteenth transistor, a control terminal of the fourteenth transistor being connected to the control terminal of the output module, an input terminal of the fourteenth transistor being connected to the input terminal of the output module, an output terminal of the fourteenth transistor being connected to the output terminal of the output module.

20. A gate driving circuit, comprising a plurality of shift register units according to claim 1, further comprising a first clock signal line and a second clock signal line, a phase of the first clock signal line being opposite to that of the second clock signal line, input terminals of output modules of respective shift register units being connected to the second clock signal line.

21. The gate driving circuit according to claim 20, wherein the shift register unit further comprising an input module, an output terminal of the input module being connected to the first node, the input module being configured to set the first node at an output turn-on level that enables the output module to be turned on when a received to-be-shifted signal is at a pulse level,
the output module being configured to output a shift signal when a level of the first node is the output turn-on level,
the unset module being configured to, after the output module outputs the shift signal, unset the level of the first node at an output turn-off level that enables the output module to be turned off,
an input terminal of an input module of a first-stage shift register unit is connected to a start signal input terminal.

22. The gate driving circuit according to claim 21, wherein second access terminals of unset control modules of respective shift register units are connected to the first clock signal line, input terminals of the output module are connected to the second clock signal line.

23. The gate driving circuit according to claim 22, wherein when input modules of respective shift register units comprise a transistor combination consisting of two transistors connected in series, control terminals of transistors in the input modules which are connected to the first node are connected to the first clock signal line.

24. A method for driving the shift register unit according to claim 1, comprising:
after the to-be-shifted signal outputs a shift signal having the same number of pulses as the received multiple pulses, applying a control signal to the control terminal of the unset control module to turn off the unset module so as to prevent the unset module from unsetting the first node.

25. The method according to claim 24, wherein the control terminal of the unset control module comprises a first control terminal, a second control terminal and a third control terminal, the unset control module being configured to turn off the unset module when the first control terminal accesses a first level and the third control terminal accesses a second level, so as to prevent the unset module from unsetting the first node; to turn on the unset module when the first control terminal accesses the second level and the second control terminal accesses the first level, or the first control terminal accesses the second level and the third control terminal accesses the first level, to unset the first node,
the method comprises:
after the to-be-shifted signal outputs a shift signal having the same number of pulses as the received multiple pulses, accessing a first level to the first control terminal, accessing a second level to the third control terminal.

26. The method according to claim 25, wherein the first control terminal of the unset control module is connected to a to-be-shifted signal input terminal, the second control terminal is connected to a shift signal output terminal of a next-stage shift register unit, and the third control terminal is connected to a global reset signal input terminal; pulse levels in the to-be-shifted signal, the shift signal and the global reset signal being identical with the first level, non-pulse levels in the to-be-shifted signal, the shift signal and the global reset signal being identical with the second level, wherein the unset control module comprises a first access terminal, a second access terminal and a third access terminal, the first access terminal being used for accessing an unset turn-off level that enables the unset module to be turned off, the second access terminal being used for accessing an unset turn-on level that enables the unset module to be turned on, the third access terminal being used for accessing an unset turn-on level that enables the unset module to be turned on;
the unset control module being configured to conduct the first access terminal with the output terminal when the first control terminal accesses the first level, conduct the second access terminal and the output terminal when the second control terminal accesses the first level, conduct the third access terminal and the output terminal when the third control terminal accesses the first level; and when the output terminal is conducted with both the first access terminal and the second access terminal, a level of the output terminal being kept identical with that of the first access terminal,
the first level is identical with a pulse level, and the second level is identical with a non-pulse level, the method comprises: accessing a to-be-shifted signal to the first control terminal of the unset control module, accessing a shift signal outputted by a next-stage shift register to the second control terminal of the unset control module, accessing a global reset signal to the third control terminal of the unset control module; and when the first control terminal of the unset control module accesses a pulse level, accessing an unset turn-off level to the first access terminal of the unset control module; when the second control terminal of the unset control module accesses a pulse level, accessing an unset turn-on level to the second access terminal of the unset control module; when the third control terminal of the unset control module accesses a pulse level, accessing an unset turn-on level to the third access terminal of the unset control module.

27. The method according to claim 26, wherein the shift register unit further comprising:
an input module, an output terminal of the input module being connected to the first node, the input module being configured to set the first node at an output turn-on level that enables the output module to be turned on when a received to-be-shifted signal is at a pulse level;
the output module being configured to output a shift signal when a level of the first node is the output turn-on level;
the unset module being configured to, after the output module outputs the shift signal, unset the level of the first node at an output turn-off level that enables the output module to be turned off;
wherein the shift register unit further comprising a pinch-off module configured to be turned on when an outputted shift signal is at a pulse level, so as to pinch off the input module and/or the unset module,
the method further comprises: when a shift signal outputted by the shift register unit is at a pulse level, applying a control signal to turn on the pinch-off module.

* * * * *